United States Patent
Luo et al.

(10) Patent No.: US 11,394,167 B2
(45) Date of Patent: Jul. 19, 2022

(54) WAVELENGTH SELECTION METHOD AND WAVELENGTH SELECTION DEVICE FOR TUNABLE LASER

(71) Applicant: InnoLight Technology (Suzhou) LTD., Jiangsu (CN)

(72) Inventors: Liang Luo, Jiangsu (CN); Wenkai Tu, Jiangsu (CN); Jinan Gu, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 78 days.

(21) Appl. No.: 16/565,567

(22) Filed: Sep. 10, 2019

(65) Prior Publication Data
US 2020/0083660 A1    Mar. 12, 2020

(30) Foreign Application Priority Data
Sep. 10, 2018  (CN) .......................... 201811052226.0

(51) Int. Cl.
*H01S 5/0687* (2006.01)
*H01S 3/10* (2006.01)
*H01S 3/13* (2006.01)

(52) U.S. Cl.
CPC ........ *H01S 3/10069* (2013.01); *H01S 3/1305* (2013.01); *H01S 5/0687* (2013.01)

(58) Field of Classification Search
CPC ............... H01S 5/02438; H01S 5/0612; H01S 5/06–0687; H01S 5/024–02492; H01S 5/141
See application file for complete search history.

(56) References Cited

U.S. PATENT DOCUMENTS 4,955,029 A * 9/1990 Lecoy ................. H01S 5/02415
                                                            372/31
6,724,790 B1 * 4/2004 Daiber ................. H01S 5/0687
                                                            372/107
(Continued)

FOREIGN PATENT DOCUMENTS

CN        1849733 A       10/2006
CN        1316696 C        5/2007
(Continued)

OTHER PUBLICATIONS

Definition and characteristic (properties) of Thermistors from www.teamWavelength.com pp. 1-6.*
(Continued)

*Primary Examiner* — Xinning(Tom) Niu
*Assistant Examiner* — Delma R Fordé
(74) *Attorney, Agent, or Firm* — Finnegan, Henderson, Farabow, Garrett & Dunner, LLP

(57) ABSTRACT

A wavelength selection method for a tunable laser includes: obtaining a target wavelength; and calculating target resistance values of two thermistors, respectively, corresponding to the target wavelength. Each of the two thermistors is used to monitor the temperature of a corresponding one of two wavelength selection components. Each of the target resistance values is calculated according to a relationship between a wavelength drift and a resistance change of the corresponding thermistor and according to an initial wavelength and an initial resistance value of the corresponding thermistor corresponding to the initial wavelength. The method further includes: heating the two wavelength selection components to control their temperatures until real-time resistance values of the two thermistors reach the target resistance values, respectively; and stabilizing the real-time (Continued)

resistance values at the target resistance values and outputting a laser beam having the target wavelength.

8 Claims, 11 Drawing Sheets

(56) References Cited

U.S. PATENT DOCUMENTS

| | | | | |
|---|---|---|---|---|
| 2002/0172239 | A1* | 11/2002 | McDonald | G02B 5/281 |
| | | | | 372/20 |
| 2003/0058906 | A1* | 3/2003 | Finn | H01S 5/06825 |
| | | | | 372/34 |
| 2008/0159340 | A1* | 7/2008 | Daiber | H01S 5/141 |
| | | | | 372/20 |
| 2010/0034224 | A1* | 2/2010 | Takabayashi | H01S 5/141 |
| | | | | 372/20 |
| 2016/0161343 | A1* | 6/2016 | Smith | G01K 13/00 |
| | | | | 374/185 |
| 2019/0165329 | A1* | 5/2019 | Huang | H01L 51/5259 |

FOREIGN PATENT DOCUMENTS

| | | |
|---|---|---|
| CN | 102812602 B | 6/2014 |
| WO | WO 02/082599 A1 | 10/2002 |
| WO | WO 2005/027286 A1 | 3/2005 |
| WO | WO 2012/126427 A2 | 9/2012 |

OTHER PUBLICATIONS

Definition of Thermistors from Encyclopedia Britannica, p. 1.*
Definition of Thermistors from Dictionary.com p. 1-3.*

* cited by examiner

| Current I (mA) | Resistance value $r_1$ ($\Omega$) | Wavelength value $\lambda_1$ (nm) | Resistance change $\triangle r_1$ ($\Omega$) | Wavelength drift $\triangle \lambda_1$ (nm) |
|---|---|---|---|---|
| 1.00 | 310.42 | 1545.94 | 0.00 | 0.00 |
| 1.50 | 310.62 | 1545.98 | 0.20 | 0.04 |
| 2.00 | 311.84 | 1546.10 | 1.42 | 0.16 |
| 2.50 | 312.23 | 1546.14 | 1.81 | 0.20 |
| 3.00 | 312.70 | 1546.20 | 2.28 | 0.26 |
| 3.50 | 313.28 | 1546.28 | 2.86 | 0.34 |
| 4.00 | 313.88 | 1546.34 | 3.46 | 0.40 |
| 4.50 | 314.59 | 1546.44 | 4.17 | 0.50 |
| 5.00 | 315.33 | 1546.54 | 4.91 | 0.60 |
| 5.50 | 316.17 | 1546.62 | 5.75 | 0.68 |
| 6.00 | 317.17 | 1546.76 | 6.75 | 0.82 |
| 6.50 | 318.17 | 1546.90 | 7.75 | 0.96 |
| 7.00 | 319.23 | 1547.04 | 8.81 | 1.10 |
| 7.50 | 320.34 | 1547.18 | 9.92 | 1.24 |
| 8.00 | 321.77 | 1547.32 | 11.35 | 1.38 |
| 8.50 | 323.10 | 1547.54 | 12.68 | 1.60 |
| 9.00 | 324.37 | 1547.70 | 13.95 | 1.76 |
| 9.50 | 326.07 | 1547.90 | 15.65 | 1.96 |
| 10.00 | 327.73 | 1548.14 | 17.31 | 2.20 |
| 10.50 | 329.45 | 1548.36 | 19.03 | 2.42 |
| 11.00 | 331.14 | 1548.60 | 20.72 | 2.66 |
| 11.50 | 333.31 | 1548.88 | 22.89 | 2.94 |
| 12.00 | 335.10 | 1549.16 | 24.68 | 3.22 |
| 12.50 | 337.30 | 1549.44 | 26.88 | 3.50 |
| 13.00 | 339.30 | 1549.68 | 28.88 | 3.74 |
| 13.50 | 341.90 | 1550.06 | 31.48 | 4.12 |
| 14.00 | 344.00 | 1550.36 | 33.58 | 4.42 |
| 14.50 | 346.80 | 1550.70 | 36.38 | 4.76 |

FIG. 8

| Current I (mA) | Square of Current $I^2$ (mA$^2$) | Resistance value $r_1$ ($\Omega$) |
|---|---|---|
| 1 | 1 | 310.42 |
| 1.5 | 2.25 | 310.62 |
| 2 | 4 | 311.84 |
| 2.5 | 6.25 | 312.23 |
| 3 | 9 | 312.7 |
| 3.5 | 12.25 | 313.28 |
| 4 | 16 | 313.88 |
| 4.5 | 20.25 | 314.59 |
| 5 | 25 | 315.33 |
| 5.5 | 30.25 | 316.17 |
| 6 | 36 | 317.17 |
| 6.5 | 42.25 | 318.17 |
| 7 | 49 | 319.23 |
| 7.5 | 56.25 | 320.34 |
| 8 | 64 | 321.77 |
| 8.5 | 72.25 | 323.1 |
| 9 | 81 | 324.37 |
| 9.5 | 90.25 | 326.07 |
| 10 | 100 | 327.73 |
| 10.5 | 110.25 | 329.45 |
| 11 | 121 | 331.14 |
| 11.5 | 132.25 | 333.31 |
| 12 | 144 | 335.1 |
| 12.5 | 156.25 | 337.3 |
| 13 | 169 | 339.3 |
| 13.5 | 182.25 | 341.9 |
| 14 | 196 | 344 |
| 14.5 | 210.25 | 346.8 |

FIG. 10

WAVELENGTH SELECTION METHOD AND WAVELENGTH SELECTION DEVICE FOR TUNABLE LASER

CROSS-REFERENCE TO RELATED APPLICATION

This application is based upon and claims priority to Chinese Patent Application 201811052226.0, filed on Sep. 10, 2018, the entire content of which is incorporated herein by reference.

FIELD OF THE DISCLOSURE

The present disclosure relates to the field of optical communication and, more particularly, to a tunable laser wavelength selection method and device.

BACKGROUND

With the fast development of big data, the Internet of Things, and 5G business, the demand for network capacity continues to increase. As a result, coherent optical communication technology that features broad bandwidth and long-distance communication becomes a top technological candidate for next-generation high-speed and high-capacity optical networks. A narrow-linewidth tunable laser, which is a highly coherent light source and local oscillator, has become a core element of coherent optical communication.

At present, mode selection solutions for narrow-linewidth tunable lasers primarily include DBR (Distributed Bragg Reflector), MEMS (Microelectromechanical System) mirror, MEMS grating, and tunable filter. The first three solutions provide the advantage of small size and integration but have drawbacks such as small adjustment range, long response time, low output power, and long calibration time. The Tunable filter solution addresses the aforementioned issues by increasing the size. For example, the Etalon Vernier system, which is a tunable filter solution, offers a number of advantages, including low loss, good power consistency, low noise, high response speed, and ultra-wide adjustment range; however, its disadvantages include long calibration time and low accuracy in mode selection.

SUMMARY

One example embodiment of the present disclosure provides a tunable laser wavelength selection method to allow fast and accurate mode selection. The tunable laser wavelength selection method provides a Vernier system that includes at least two thermally tunable wavelength selection components which include a first wavelength selection component and a second wavelength selection component. The tunable laser wavelength selection method includes:

obtaining a target wavelength $\lambda$;

calculating target resistance values $R_1$ and $R_2$ of two thermistors, respectively, corresponding to the target wavelength $\lambda$, each of the two thermistors being used to monitor the temperature of a corresponding one of the first and second wavelength selection components, each of the target resistance values $R_1$ and $R_2$ being calculated according to a relationship between a wavelength drift $\Delta\lambda$ and a resistance change $\Delta R$ of the corresponding thermistor and according to an initial wavelength $\lambda_0$ and its corresponding one of initial resistance values $R_{01}$ and $R_{02}$ of the corresponding thermistors;

heating the first and second wavelength selection components to control the temperatures of the first and second wavelength selection components until real-time resistance values of the two thermistors reach the target resistance values $R_1$ and $R_2$, respectively; and stabilizing the resistance values of the two thermistors at the target resistance values $R_1$ and $R_2$, respectively, and outputting a laser beam having the target wavelength.

Another example embodiment of the present disclosure provides a tunable laser wavelength selection device, including: a first wavelength selection component and a second wavelength selection component on an optical path; a control component. The control component includes a controller, a storage device, a first heating component to heat the first wavelength selection component, a second heating component to heat the second wavelength selection component, a first thermistor to monitor the first wavelength selection component, and a second thermistor to monitor the second wavelength selection component. The storage device is configured to pre-store an expression of relationship $\Delta\lambda=k*\Delta R$ between a wavelength drift $\Delta\lambda$ of the wavelength selection component and a resistance change $\Delta R$ of the corresponding thermistor, as well as the initial wavelength $\lambda_0$ and its corresponding one of an initial resistance value $R_{01}$ of the first thermistor and an initial resistance value $R_{02}$ of the second thermistor. The controller is configured to: calculate and lock target resistance values $R_1$ and $R_2$ of the first thermistor and the second thermistor corresponding to the target wavelength $\lambda$ by using data stored in the storage device; and stabilize real-time resistance values of the first thermistor and the second thermistor, respectively, at the target resistance values $R_1$ and $R_2$ by controlling currents in the first heating component and the second heating component.

BRIEF DESCRIPTION OF THE DRAWINGS

FIG. 8 shows experimental data from one specific example embodiment.

FIG. 10 shows experimental data from one specific illustrative example.

DETAILED DESCRIPTION

Figure 1:
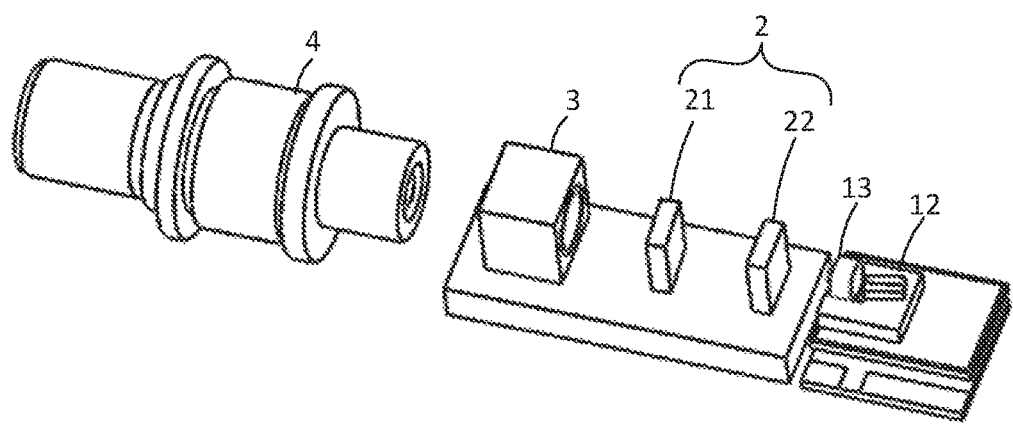
FIG. 1 is a diagram illustrating a tunable laser according one example embodiment.

The text below provides a detailed description of the present disclosure with reference to specific embodiments illustrated in the attached drawings. However, these embodiments do not limit the present disclosure; the scope of protection for the present disclosure covers changes made to the structure, method, or function by persons having ordinary skill in the art on the basis of these embodiments.

In order to facilitate the presentation of the drawings in the present disclosure, the sizes of certain structures or portions have been enlarged relative to other structures or portions; therefore, the drawings in the present application are only for the purpose of illustrating the basic structure of the subject matter of the present application.

Additionally, terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being located "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly.

FIG. 1 is a diagram showing a tunable laser 100 according to one example embodiment.

The tunable laser 100 includes, sequentially arranged along an optical path of a light beam, a laser gain chip 12, a collimating lens 13, a tunable wavelength selection device 2, a mirror 3, and a receptacle 4 with an isolator.

The laser gain chip 12 and the mirror 3, through the collimating lens 13, form a laser external cavity. The light emitted by the gain chip 12 resonates in the laser external cavity to generate at least one laser mode. The wavelength selection device 2 located in the laser external cavity selects one of the laser modes to achieve wavelength-adjustable single-mode output.

In the present example embodiment, the wavelength selection device 2 of the tunable laser 100 includes at least two thermally tunable wavelength selection components on the optical path.

For illustrative purpose, the wavelength selection device 2 includes two wavelength selection components, which are, respectively, a first wavelength selection component 21 and a second wavelength selection component 22. The first wavelength selection component 21 and the second wavelength selection component 22 constitute a Vernier system; however, the present disclosure is not limited thereby.

The first wavelength selection component 21 and the second wavelength selection component 22 may be made of silicon material.

Figure 2:
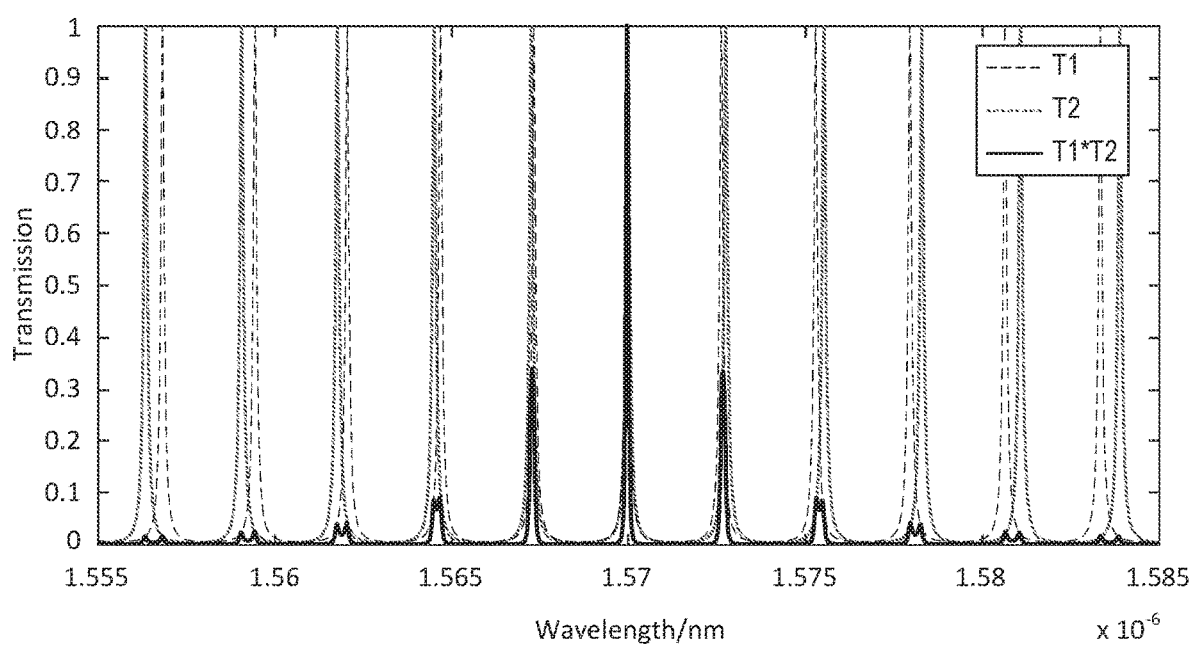
FIG. 2 is a diagram illustrating free spectrums according to one example embodiment.

FIG. 2 is a diagram illustrating free spectrums according to one example embodiment. Referring to FIG. 2, each of the first wavelength selection component 21 and the second wavelength selection component 22 is configured to define a spectrum (transmission function) T1 or T2 having a plurality of pass bands or transmission peaks. The maxima of the peaks are separated by a distance equal to a free spectral range. The first wavelength selection component 21 and the second wavelength selection component 22 are different in thickness so that the first wavelength selection component 21 and the second wavelength selection component 22 have different free spectral ranges, which in turn produce a Vernier effect in which one peak of the first wavelength selection component 21 and one peak of the second wavelength selection component 22 will overlap, and output a narrow-linewidth spectrum T1*T2 having a peak at a target wavelength λ, thereby realizing mode selection.

More particularly, reference is made to Equation (1) through Equation (3) below.

Equation (1) is a transmission function T for the Vernier system formed by the two wavelength selection components 21 and 22. In Equation (1), $T_1$ and $T_2$ are the transmission functions of the first wavelength selection component 21 and the second wavelength selection component 22, respectively; F is a fineness coefficient that is related to reflectance of a reflective film plated inside the first wavelength selection component 21 and the second wavelength selection component 22, respectively. The two wavelength selection components 21 and 22 are distinguished by a fine distinction between $n_1 d_1$ and $n_2 d_2$ ($n_1$ and $n_2$ are the refractive indices of the first wavelength selection component 21 and the second wavelength selection component 22, respectively; and $d_1$ and $d_2$ are the thicknesses of the first wavelength selection component 21 and the second wavelength selection component 22, respectively, $d_1$ and $d_2$ being different).

Only when $n_1 d_1$ and $n_2 d_2$ meet the conditions set forth by Equation (2), will there be an overlapping area between a first free spectral range FSR1 of the first wavelength selection component 21 and a second free spectral range FSR2 of the second wavelength selection component 22. In Equation (2), $v_0$ is a peak of the overlapping area; c is the speed of light; $m_1$ and $m_2$ are the order spectrum of the first wavelength selection component 21 and the second wavelength selection component 22, respectively, and $m_1$ and $m_2$ are positive integers. The peak wavelength in the overlapping area is selected and all other wavelengths are filtered out, thereby forming an optical bandpass filter with a wide free spectrum, i.e., a Vernier system.

Here, when changing the temperatures of the wavelength selection components by heating, $n_1 d_1$ and $n_2 d_2$ change accordingly due to the thermo-optic effect of the silicon material, thus realizing wavelength selection within the free spectral range of the Vernier system. Equation (3) shows a method to calculate the free spectral range of the Vernier system.

$$T = T_1 T_2 = \frac{1}{1 + F\sin^2\left(\frac{2\pi v}{c} n_1 d_1\right)} \frac{1}{1 + F\sin^2\left(\frac{2\pi v}{c} n_2 d_2\right)} \quad (1)$$

$$v_0 = m_1 \frac{c}{2n_1 d_1} = m_2 \frac{c}{2n_2 d_2} \quad (2)$$

$$FSR = \frac{FSR_1 * FSR_2}{FSR_1 - FSR_2} \quad (3)$$

In this example embodiment, low-power and adjustment within a wide free spectral range may be realized by the Vernier system formed by the two wavelength selection components 21 and 22. For example and without limitation, the FSRs of the two wavelength selection components 21 and 22 can be 300 GHz and 310 GHz, respectively, and the adjustable range of the Vernier system formed by the two wavelength selection components 21 and 22 is 70 nm. When one of the wavelength selection components 21 and 22 is being adjusted, the interval between adjacent modes is approximately 2.4 nm, and one selection component exhibits left shifting overall and the other selection component exhibits right shifting overall.

Within a single Vernier mode (a single peak), the two wavelength selection components 21 and 22 may be adjusted at the same time to realize calibration within 2.4 nm. Or, by holding one wavelength selection component 21 or 22 unchanged and adjusting the other wavelength selection component 21 or 22 at a step size of 10 GHz, the next Vernier mode may be selected, and then the two wavelength selection components may be adjusted at the same time for calibration. These steps are repeated until the calibration of the entire adjustable range is completed.

Figure 3:
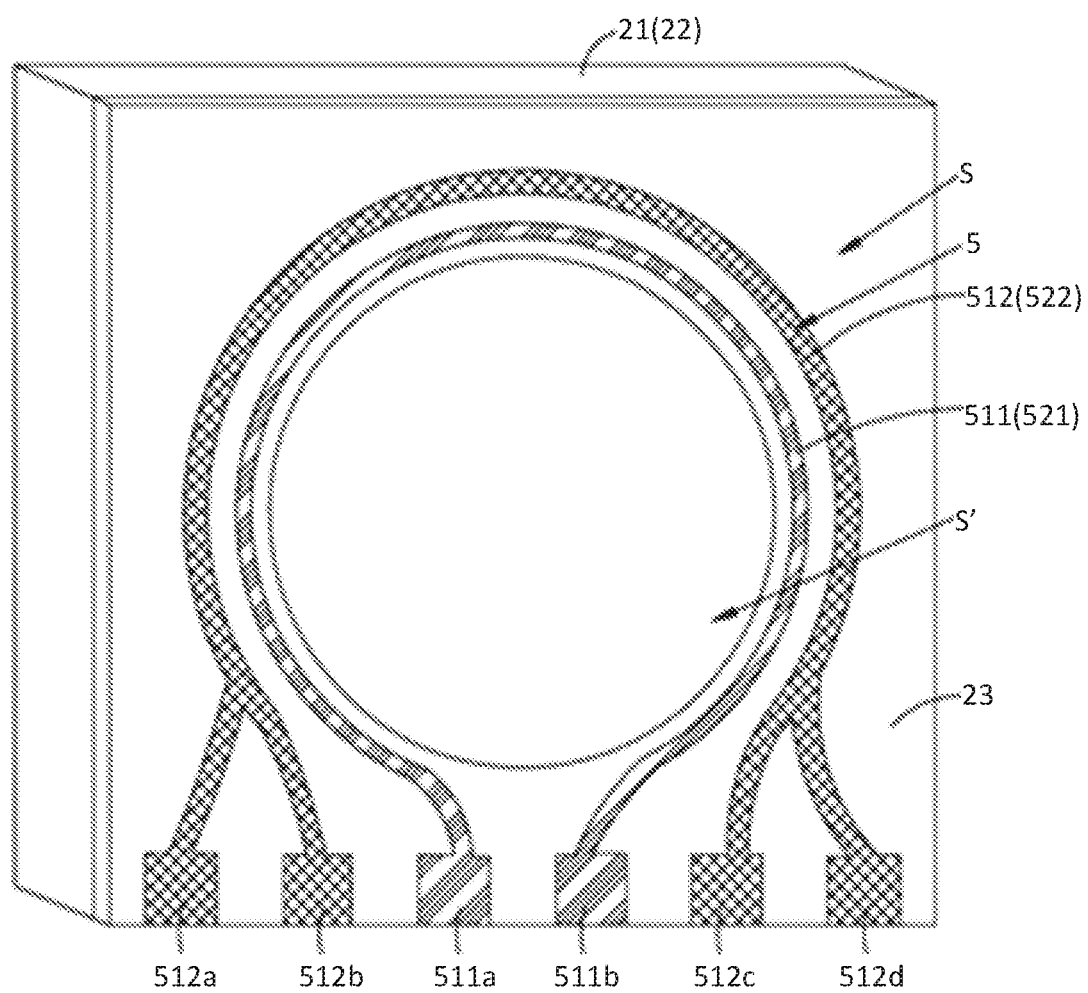
FIG. 3 is a diagram illustrating a wavelength selection component according to one example embodiment.

FIG. 3 is a diagram illustrating the first wavelength selection component 21 or the second wavelength selection component 22 according to one example embodiment. In this example embodiment, referring to FIG. 3, the wavelength selection device 2 of the tunable laser 100 further includes a control component 5, the control component 5 including a first heating component 511 and a first thermistor 512, both disposed on a surface of the first wavelength selection component 21.

The first heating component 511 is used for heating the first wavelength selection component 21. In the example presented here, the first heating component 511 is a resistance heating wire.

The first thermistor 512 is used for monitoring the temperature of the first wavelength selection component 21.

Similarly, the control component 5 further includes a second heating component 521 and a second thermistor 522, both disposed on a surface of the second wavelength selection component 22.

The second heating component 521 is used for heating the second wavelength selection component 22. In the example presented here, the second heating component 521 is a resistance heating wire.

The second thermistor 522 is used for monitoring the temperature of the second wavelength selection component 22.

The first wavelength selection component 21, the first heating component 511, and the first thermistor 512 are described below as an illustrative example.

The first heating component 511 and the first thermistor 512 are disposed on a thermally conductive substrate 23 and are overlaid on a light passing surface S of the first wavelength selection component 21 by means of the thermally conductive substrate 23.

The thermally conductive substrate 23 may use a transparent thermally conductive material or have a light-passing aperture S' in the middle. The light passing aperture S' is disposed on the aforementioned optical path (i.e., the path/optical axis of a laser beam). The first heating component 511 and the first thermistor 512 are evenly distributed on an outside margin of the light-passing aperture S'.

Here, the first heating component 511 and the first thermistor 512 are both disposed along the rim of the light-passing aperture S', and the first heating component 511 is located on the inside of the first thermistor 512.

Specifically, the thermally conductive substrate 23 is adhered to the surface of the first wavelength selection component 21 by means of a thermally conductive adhesive. The thermally conductive substrate 23 has a thin sheet structure. An outline of the thermally conductive substrate 23 and an outline of the first wavelength selection component 21 adapt to one another. The first heating component 511 and the first thermistor 512 are plated on the thermally conductive substrate 23. In this example embodiment, the thermally conductive substrate 23 is made of silicon material with good thermal conductivity performance.

The thermally conductive substrate 23, and the first heating component 511 and the first thermistor 512 that are located on the thermally conductive substrate 23, are made in batches using a MEMS process, which provides advantages such as small size, low cost, and high consistency. The process can guarantee the evenness of the resistance values of the first heating component 511 and the first thermistor 512, thereby realizing even heating and reliable temperature control. In addition, the difficulty of processing may be reduced by adhering the thermally conductive substrate 23 onto the corresponding first wavelength selection component 21 after the thermally conductive substrate 23, the first heating element 511, and the first thermistor 512 are formed as one piece.

In this example embodiment, the first heating component 511 is a resistance heating wire 511. A first wire terminal 511a and a second wire terminal 511b at the two ends of the resistance heating wire 511 are connected, respectively, to the two ends of an external current source. The first wire terminal 511a and the second wire terminal 511b are used to receive a current so that the resistance heating wire 511 heats the first wavelength selection component 21 evenly. The thermo-optic effect is realized by the change in the temperature of the first wavelength selection component 21. The transmission spectrum of the first wavelength selection component 21 exhibits a wavelength drift which, in concert with the wavelength drift of the second wavelength selection component 22, allows the realization of mode selection.

A current wire terminal and a voltage wire terminal for measuring the first thermistor 512 are disposed at each of the two ends of the first thermistor 512.

Specifically, the left end of the first thermistor 512 includes, sequentially, a first current wire terminal 512a and a first voltage wire terminal 512b, and the right end of the first thermistor 512 includes, sequentially, a second voltage wire terminal 512c and a second current wire terminal 512d. The two current wire terminals 512a and 512d are connected to an external current source, and the two voltage wire terminals 512b and 512c are connected to a voltage meter. This allows the use of the Kelvin four-wire method to measure the real-time resistance value of the first thermistor 512.

Figure 4:
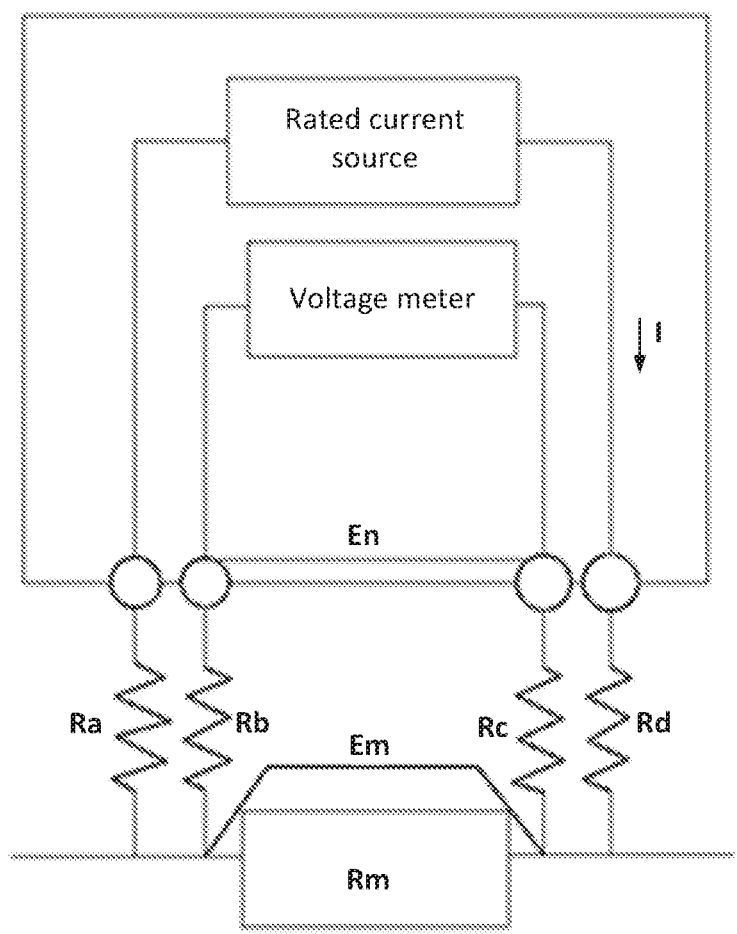
FIG. 4 is a circuit diagram illustrating the Kelvin four-wire method for measurement according to one example embodiment.

FIG. 4 is a circuit diagram illustrating the Kelvin four-wire method for measurement according to one example embodiment.

Here, the external wires connected to the first current wire terminal 512a, the first voltage wire terminal 512b, the second voltage wire terminal 512c, and the second current wire terminal 512d are equated, respectively, to a first resistor Ra, a second resistor Rb, a third resistor Rc, and a fourth resistor Rd, and the current I is all the current that flows through the resistor Rm which is equated to the first thermistor 512 or the second thermistor 522 that is being measured. At this time, both of the voltage drop across the second resistor Rb and the voltage drop across the third resistor Rc are zero, and the measurement voltage En is essentially the same as the voltage drop Em between the two ends of the resistor Rm that is being measured. In other words, the measured resistance value of the resistor Rm that is being measured is not influenced by the first resistor Ra, the second resistor Rb, the third resistor Rc, or the fourth resistor Rd.

In comparison with the traditional measurement method that measures the thermistor's resistance value between two wire terminals, the four-wire method for measurement in this example embodiment uses separate current and voltage wire terminals on the two ends of the thermistor, thus eliminating the impedance caused by the wiring and contact resistance, allowing more accurate measurement, and improving the circuit accuracy. In this example embodiment, the Kelvin four-wire method is used to measure the real-time resistance value of the first thermistor 512, thereby allowing accurate and real-time feedback, monitoring, and control of the temperature of the first wavelength selection component 21.

For the description of the second wavelength selection component 22, the second heating component 521, and the second thermistor 522, please refer to the description of the first wavelength selection component 21, the first heating component 511, and the first thermistor 512; the details are not repeated here. Of course, they may be different.

Figure 5:
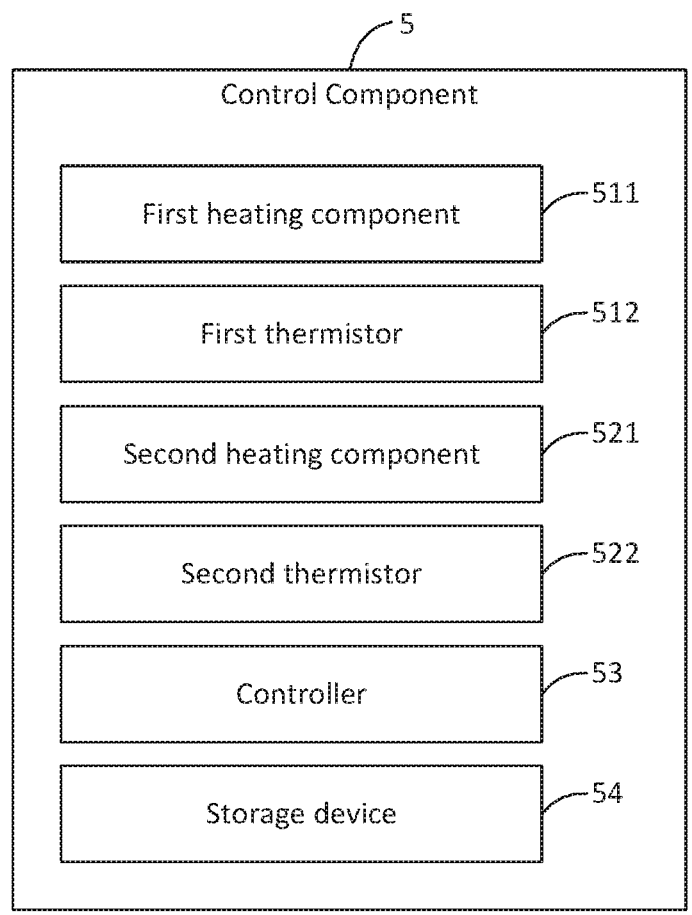
FIG. 5 is a diagram illustrating a control component according to one example embodiment.

FIG. 5 is a diagram illustrating the control component 5 according to one example embodiment. In this example embodiment, referring to FIG. 5, the control component 5 further includes a controller 53 and a storage device 54.

The storage device 54 pre-stores an expression of a relationship between the wavelength drift $\Delta\lambda$ of each of the wavelength selection components 21 and 22 and the resistance change $\Delta R$ of a corresponding one of the thermistors 512 and 522 disposed on the wavelength selection component: $\Delta\lambda=k*\Delta R$; the initial wavelength $\lambda 0$ and its corresponding initial resistance value $R_{01}$ of the first thermistor 512 and initial resistance value $R_{02}$ of the second thermistor 522; the coefficients of the relationship between the resistance changes of the two thermistors and the wavelength drift: k1 and k2; and target resistance values $R_1=(\lambda-\lambda_0)/k_1+R_{01}$ and $R_2=(\lambda-\lambda_0)/k_2+R_{02}$ of the two thermistors 512 and 522.

The controller 53 calculates and locks the target resistance values $R_1$ and $R_2$ of the first thermistor 512 and the second thermistor 522 corresponding to the target wavelength $\lambda$ by using data stored in the storage device 54. The controller 53 heats the first wavelength selection component 21 and the second wavelength selection component 22 and stabilizes the resistance values of the first thermistor 512 and the second thermistor 522 at the target resistance values $R_1$ and $R_2$, respectively, by controlling the currents in the first heating component 511 and the second heating component 521.

Here, for a given tunable laser, the relationship between the wavelength drift $\Delta\lambda$ of the wavelength selection component included therein and the resistance change $\Delta R$ of the thermistor disposed on the wavelength selection component remains constant. Therefore, once the target wavelength $\lambda$ is locked, the target resistance values $R_1$ and $R_2$ of the first thermistor 512 and the second thermistor 522 may be obtained according to the expression of the relationship between the wavelength drift $\Delta\lambda$ and the resistance change $\Delta R$, the initial wavelength $\lambda_0$, and the initial resistance values $R_{01}$ and $R_{02}$. At this time, when adjusting the currents in the first heating component 511 and the second heating component 521 to heat, respectively, the first wavelength selection component 21 and the second wavelength selection component 22, only the resistance values of the first thermistor 512 and the second thermistor 522 need to be monitored and controlled to be stabilized at the target resistance values $R_1$ and $R_2$ for the output wavelength from the first wavelength selection component 21 and the second wavelength selection component 22 to be the target wavelength $\lambda$, thus realizing accurate mode selection.

In other words, the first wavelength selection component 21 and the second wavelength selection component 22 are thermally tunable wavelength selection components. In order to ensure that the superimposed spectrum output from the first wavelength selection component 21 and the second wavelength selection component 22 is the target wavelength $\lambda$, the temperatures of the first wavelength selection component 21 and the second wavelength selection component 22 need to be stabilized, respectively, at target temperatures $t_1$ and $t_2$. The real-time feedback from the first thermistor 512 and the second thermistor 522 is the real-time temperatures of the first wavelength selection component 21 and the second wavelength selection component 22. At this time, the control component 5 only needs to stabilize the resistance values of the first thermistor 512 and the second thermistor 522, respectively, at the target resistance values $R_1$ and $R_2$ corresponding to the target temperatures $t_1$ and $t_2$ to ensure that the temperatures of the first wavelength selection component 21 and the second wavelength selection component 22 stabilize, respectively, at the target temperatures $t_1$ and $t_2$, which in turn ensures that the output is the target wavelength $\lambda$.

As can be seen, this example embodiment changes the temperatures of the wavelength selection components by heating to realize the thermo-optic effect, and, at the same time, the temperatures of the corresponding wavelength selection components are monitored and controlled in real-time by means of thermistors. In this way, the mutual heat impact between the two wavelength selection components and the temperature drift characteristics of the heating components as a result of heat radiation and heat conduction, may be avoided, thereby realizing real-time temperature control and accurate mode selection.

Additionally, in the example embodiment, the first wavelength selection component 21 and the second wavelength selection component 22 are made of silicon material. According to the thermo-optic effect of silicon, a curve may be fitted to show the relationship between the wavelength drift $\Delta\lambda$ and the resistance change $\Delta R$ of the thermistor for each of the two wavelength selection components, thereby saving a majority part of the time for calibrating the wavelength of the tunable laser and simplifying the mode selection process.

Of course, in different tunable lasers, the coefficient of relationship k in the expression of relationship $\Delta\lambda=k*\Delta R$ may be different and may be obtained by means of fitting according to actual test data.

Figure 6:
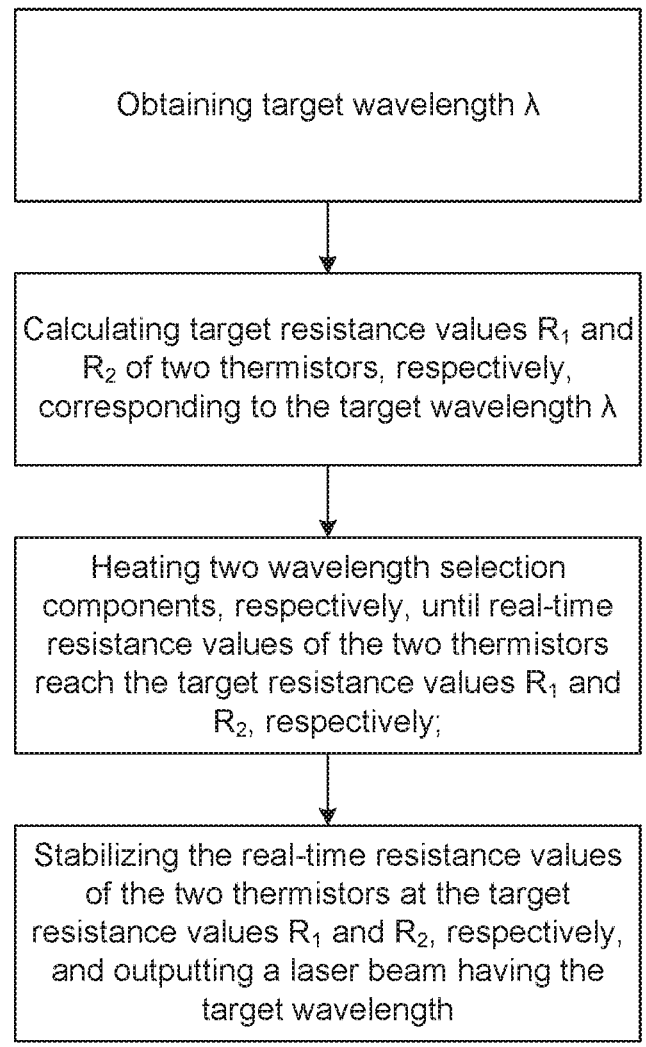
FIG. 6 is a diagram illustrating the steps of a tunable laser wavelength selection method according to one example embodiment.

Referring to FIG. 6, one example embodiment of the present disclosure provides a tunable laser wavelength selection method. In reference to the earlier description of the tunable laser 100 and the wavelength selection device 2 of the tunable laser 100, the wavelength selection method includes the following steps:

obtaining the target wavelength $\lambda$;

calculating the target resistance values $R_1$ and $R_2$ of the two thermistors 512 and 522 corresponding to the target wavelength $\lambda$ according to the relationship between the wavelength drift $\Delta\lambda$ and the resistance change $\Delta R$ of the thermistor of the corresponding wavelength selection component and according to the known initial wavelength $\lambda_0$ and its corresponding initial resistance values $R_{01}$ and $R_{02}$ of the two thermistors 512 and 522, the at least two thermistors 512 and 522 being used, respectively, to monitor the temperatures of the two wavelength selection components 21 and 22;

heating the two wavelength selection components (the first wavelength selection component 21 and the second wavelength selection component 22), respectively, to control the temperatures of the two wavelength selection components 21 and 22 until the real-time resistance values of the two thermistors (the first thermistor 521 and the second thermistor 522) reach the target resistance values $R_1$ and $R_2$, respectively; and stabilizing the real-time resistance values of the two thermistors at the target resistance values $R_1$ and $R_2$, respectively, and outputting a laser beam having the target wavelength $\lambda$ at this time.

Here, for a given tunable laser, the relationship between the wavelength drift $\Delta\lambda$ of the wavelength selection component and the resistance change $\Delta R$ of the thermistor remains constant. Therefore, referring to FIG. 7, once the target wavelength $\lambda$ is locked, the target resistance values $R_1$ and $R_2$ of the first thermistor 512 and the second thermistor 522 may be obtained according to the expression of the relationship, the initial wavelength $\lambda_0$, and the initial resistance values $R_{01}$ and $R_{02}$. At this time, when adjusting the currents in the first heating component 511 and the second heating component 521 to heat, respectively, the first wavelength selection component 21 and the second wavelength selection component 22, only the resistance values of the first thermistor 512 and the second thermistor 522 need to be monitored and controlled to be stabilized at the target resistance values $R_1$ and $R_2$ for the output wavelength from the first wavelength selection component 21 and the second wavelength selection component 22 to be the target wavelength $\lambda$, thus realizing accurate mode selection.

In other words, the first wavelength selection component 21 and the second wavelength selection component 22 are thermally tunable wavelength selection components. In order to ensure that the superimposed spectrum output from the first wavelength selection component 21 and the second wavelength selection component 22 is the target wavelength $\lambda$, the temperatures of the first wavelength selection component 21 and the second wavelength selection component 22 need to be stabilized, respectively, at target temperatures $t_1$ and $t_2$. The real-time feedback from the first thermistor 512 and the second thermistor 522 is the real-time temperatures of the first wavelength selection component 21 and the second wavelength selection component 22. At this time, it only requires the stabilization of the resistance values of the first thermistor 512 and the second thermistor 522, respectively, at the target resistance values $R_1$ and $R_2$ in order to ensure that the temperatures of the first wavelength selection component 21 and the second wavelength selection component 22 stabilize, respectively, at the target temperatures $t_1$ and $t_2$, which in turn ensures that the output is the target wavelength $\lambda$.

In this example embodiment, a majority part of the time for calibrating the tunable laser is saved, and the process of mode selection is simplified.

Figure 7:
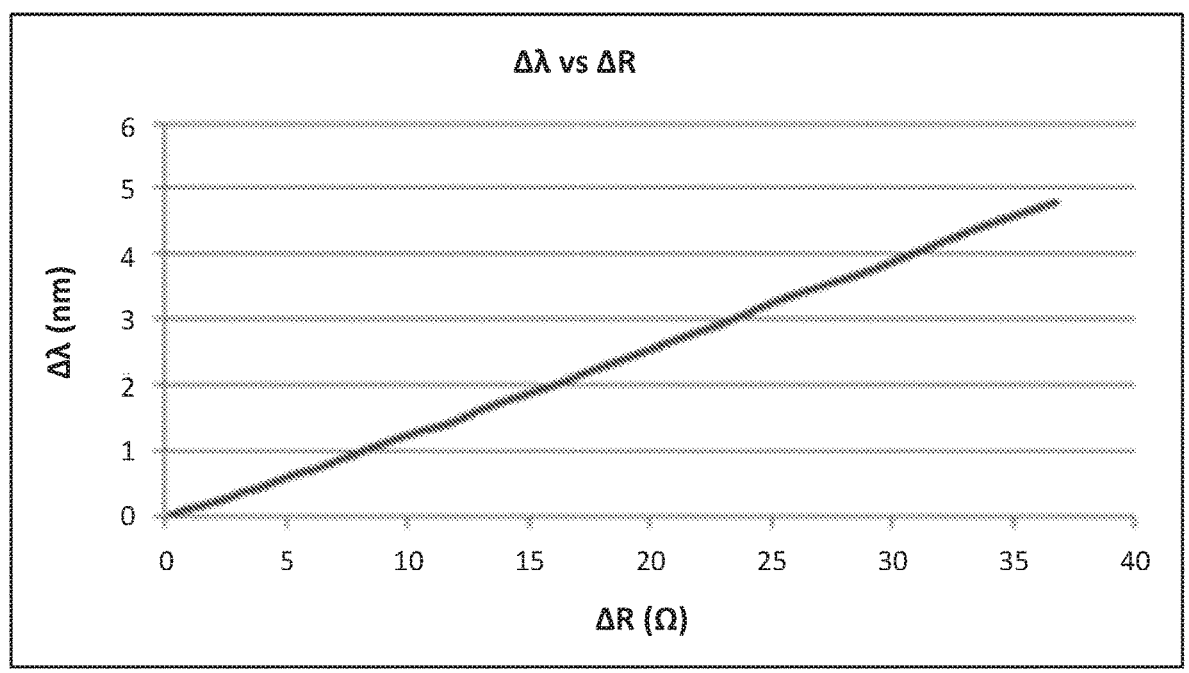
FIG. 7 is a fitted curve showing a relationship between a wavelength drift and a resistance change of a thermistor according to one example embodiment.

Specifically, referring to FIG. 7, there is a linear relationship between the wavelength drift $\Delta\lambda$ and the resistance change of the thermistor $\Delta R$: $\Delta\lambda=k*\Delta R$ for each one of the wavelength selection components 21 and 22. The expressions of the relationships may be obtained by changing the currents in the two heating components 511 and 521, measuring the resistance values of the two thermistors 512 and 522 corresponding to various output wavelengths, calculating the resistance changes corresponding to the wavelength drifts, and then fitting to the numerical values of the wavelength drifts and resistance changes of the thermistors 512 and 522.

Assuming the obtained coefficients of the relationship are k1 and k2, respectively, then, the wavelength drift of the first wavelength selection component 21 is $\Delta\lambda_1=\lambda-\lambda_0=k_1*(R_1-R_{01})$. Thus, the target resistance value of the first thermistor 521 is $R_1=(\lambda-\lambda_0)/k_1+R_{01}$.

Similarly, the wavelength drift of the second wavelength selection component 22 is $\Delta\lambda_2=\lambda-\lambda_0=k_2*(R_2-R_{02})$. Thus, the target resistance value of the second thermistor 522 is $R_2=(\lambda-\lambda_0)/k_2+R_{02}$.

It needs to be noted that the linear relationship between the wavelength drift $\Delta\lambda$ and the resistance change of the thermistor $\Delta R$ may also be $\Delta\lambda=k*\Delta R+a$. The relationship should be determined based on the actual circumstance.

In the step of heating the two wavelength selection components 21 and 22, respectively, to control the temperatures of the two wavelength selection components 21 and 22 until the resistance values of the two thermistors 512 and 522 reach the target resistance values $R_1$ and $R_2$, respectively, of this example embodiment, the temperatures of the wavelength selection components 21 and 22 may be adjusted by means of adjusting the currents in the heating components 511 and 521 disposed on the corresponding wavelength selection components 21 and 22.

Here, an example is provided in which the currents in the first heating component 511 disposed on the first wavelength selection component 21 and in the second heating component 521 disposed on the second wavelength selection component 22 are adjusted.

Figure 9:
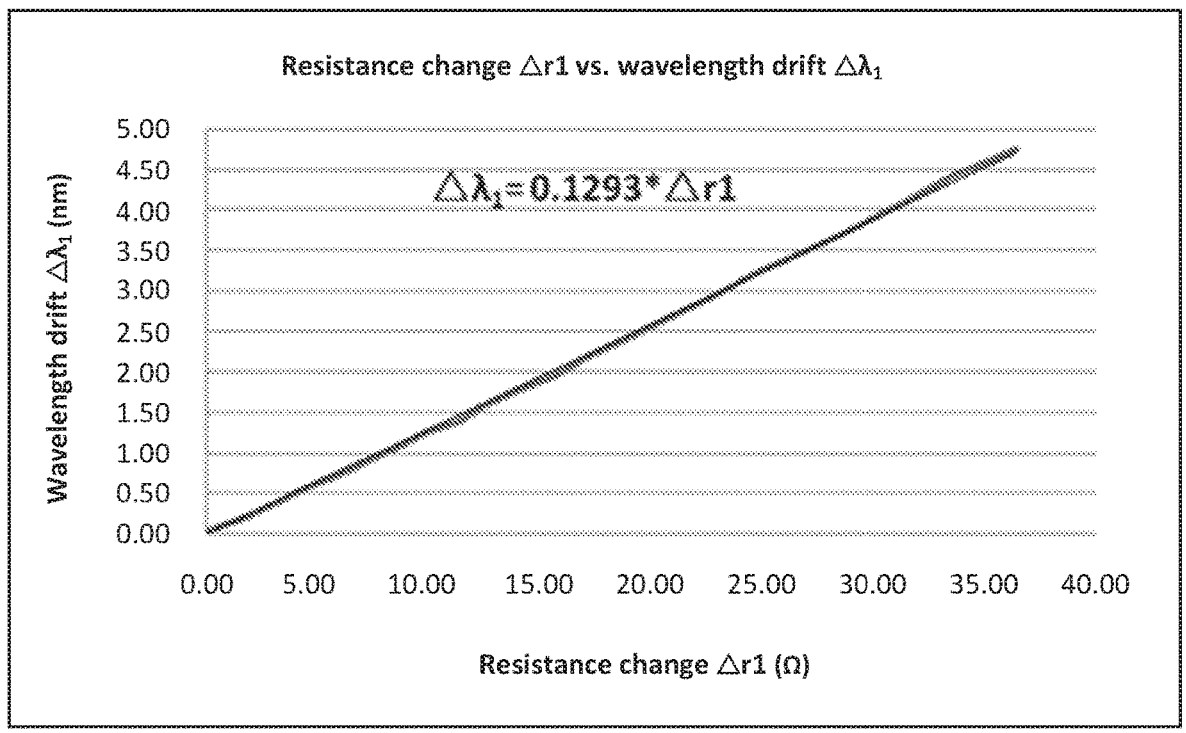
FIG. 9 is a curve fitted to the data in FIG. 8 showing the relationship between the wavelength drift and the resistance change.

FIGS. 8 and 9 show experimental data and fitted curve from one specific example embodiment.

For illustrative purposes, the first wavelength selection component 21, the first thermistor 521, and the first heating component 511 are discussed.

A gradually increasing current I (1 mA, 1.5 mA, 2 mA, ..., 14.5 mA) is supplied to the first heating component 511. At the same time, the wavelength value $\lambda_1$ and the wavelength drift $\Delta\lambda_1$ of the corresponding first wavelength selection component 21, and the resistance value $r_1$ of the first thermistor 521 are monitored in real-time.

As can be seen, in reference to FIG. 8, as the current I supplied to the first heating component 511 increases, the wavelength value $\lambda_1$ and the wavelength drift $\Delta\lambda_1$ of the first wavelength selection component 21 and the resistance value $r_1$ and resistance change $\Delta r_1$ of the first thermistor 521 all exhibit trends of gradual increase.

FIG. 9 shows a fitted curve of the relationship between the wavelength drift $\Delta\lambda_1$ of the first wavelength selection component 21 and the resistance change $\Delta r_1$ of the first thermistor 521, where the relationship between the wavelength drift $\Delta\lambda_1$ and the resistance change $\Delta r_1$ is linear. Specifically, the expression of the linear relationship is: $\Delta\lambda_1=k'*r_1$. According to the fitting to the actual test data values in this example embodiment, k'=0.1293. The value of k' may be different for a different laser or for the fitted expression of the relationship between the wavelength drift of a different wavelength selection component and the resistance change of the thermistor on such wavelength selection component. The aforementioned fitted expression of the relationship needs to be created for each wavelength selection component and pre-stored in the storage device 54.

In this example embodiment, there are multiple specific illustrative examples of current control for the first heating component 511 and the second heating component 521. Three illustrative examples are presented below.

In the first specific illustrative example, the step of heating the two wavelength selection components 21 and 22, respectively, to control the temperatures of the two wavelength selection components 21 and 22 until the resistance values of the two thermistors 512 and 522 reach the target resistance values $R_1$ and $R_2$, respectively, includes the following steps:

separately and gradually changing the currents in the heating components 511 and 521 on the two wavelength selection components 21 and 22 and, at the same time, determining whether the real-time resistance values $r_1$ and $r_2$ of the two thermistors 512 and 522 are equal to the target resistance values $R_1$ and $R_2$, respectively;

if the two real-time resistance values $r_1$ and $r_2$ are not equal to the target resistance values $R_1$ and $R_2$, then continuing to change the currents; and if the two real-time resistance values $r_1$ and $r_2$ are equal to the target resistance values $R_1$ and $R_2$, respectively, then stabilizing or fine-tuning the current values at this time to lock the real-time resistance values $r_1$ and $r_2$ at the target resistance values $R_1$ and $R_2$, respectively.

In this illustrative example, the measured real-time resistance values $r_1$ and $r_2$ of the two thermistors 512 and 522 may be locked at the target resistance values $R_1$ and $R_2$, respectively, by means of changing the currents gradually. The use of the gradual approximation method in this illustrative example allows effective reduction of the difficulty in obtaining the target resistance values, eliminates the need to calibrate the currents, and requires no prior knowledge of the corresponding currents.

Of course, the currents may be calibrated or estimated in advance to improve the efficiency in adjusting the currents and complete the adjustment in one step, as demonstrated in the two following illustrative examples.

In the second specific illustrative example, the step of heating the two wavelength selection components 21 and 22, respectively, to control the temperatures of the two wavelength selection components 21 and 22 until the resistance values of the two thermistors 512 and 512 reach the target resistance values $R_1$ and $R_2$, respectively, includes the following steps:

searching for the current values $I_1$ and $I_2$ that respectively correspond to the target resistance values $R_1$ and $R_2$ among the pre-stored resistance values corresponding to the wavelengths of all communication channels and their corresponding current values;

providing currents that are equal to the current values $I_1$ and $I_2$ to the first heating component 511 and the second heating component 512, respectively, and, at the same time, determining whether the real-time resistance values $r_1$ and $r_2$ of the two thermistors 512 and 522 are equal to the target resistance values $R_1$ and $R_2$, respectively;

if the two real-time resistance values $r_1$ and $r_2$ are not equal to the target resistance values $R_1$ and $R_2$, then fine-tuning the currents until the two real-time resistance values $r_1$ and $r_2$ are equal to the target resistance values $R_1$ and $R_2$, respectively; and if the real-time resistance values $r_1$ and $r_2$ are equal to the target resistance values $R_1$ and $R_2$, respectively, then stabilizing the current values at this time to lock the real-time resistance values $r_1$ and $r_2$ at the target resistance values $R_1$ and $R_2$, respectively.

In this illustrative example, the current values $I_1$ and $I_2$ corresponding to the target resistance values $R_1$ and $R_2$ may be obtained directly by searching through a table. Next, currents that are equal to the obtained current values $I_1$ and $I_2$ are supplied to the first heating component 21 and the second heating component 22, respectively. Then gradual approximation and locking are performed on the two real-time resistance values $r_1$ and $r_2$ against the two target resistance values $R_1$ and $R_2$, respectively. The current values $I_1$ and $I_2$ obtained from searching through a table are already very close to the final current values needed. Therefore, only fine-tuning is needed to make the real-time resistance values $r_1$ and $r_2$ equal to the target resistance values $R_1$ and $R_2$, thereby significantly reducing the time required for the adjustment.

In the third specific illustrative example, the step of heating the two wavelength selection components 21 and 22, respectively, to control the temperatures of the two wavelength selection components 21 and 22 until the resistance values of the two thermistors reach the target resistance values $R_1$ and $R_2$, respectively, includes the following steps:

calculating the currents $I_1$ and $I_2$ that correspond to the two target resistance values $R_1$ and $R_2$, respectively, according to the relationship between the resistance value R of the thermistor and the current I of the heating component:

$$R = m*I^2 + R0;$$

supplying currents that are equal to the calculated current values $I_1$ and $I_2$ to the first heating component 511 and the second heating component 521, respectively, and, at the same time, determining whether the real-time resistance values $r_1$ and $r_2$ of the two thermistors 512 and 522 are equal to the target resistance values $R_1$ and $R_2$, respectively;

if the two real-time resistance values $r_1$ and $r_2$ are not equal to the target resistance values $R_1$ and $R_2$, then fine-tuning the currents until the two real-time resistance values $r_1$ and $r_2$ are equal to the target resistance values $R_1$ and $R_2$; and if the two real-time resistance values $r_1$ and $r_2$ are equal to the target resistance values $R_1$ and $R_2$, respectively, then stabilizing the current values at this time to lock the real-time resistance values $r_1$ and $r_2$ at the target resistance values $R_1$ and $R_2$, respectively.

In this illustrative example, the expression of the relationship between the resistance value R of the thermistor and the current I of the heating component may be obtained in advance in an experiment. When the adjustment is being performed, only the target resistance values $R_1$ and $R_2$ and the expression of relationship are needed to calculate the corresponding current values $I_1$ and $I_2$. Next, currents that are equal to the obtained current values $I_1$ and $I_2$ are supplied to the first heating component 21 and the second heating component 22, respectively. Then gradual approximation and locking are performed on the two real-time resistance values $r_1$ and $r_2$ against the two target resistance values $R_1$ and $R_2$, respectively. The current values $I_1$ and $I_2$ obtained according to the expression of the relationship are already very close to the final current values needed. Therefore, only fine-tuning is needed to make the real-time resistance values $r_1$ and $r_2$ equal to the target resistance values $R_1$ and $R_2$, significantly reducing the time required for the adjustment.

Figure 11:
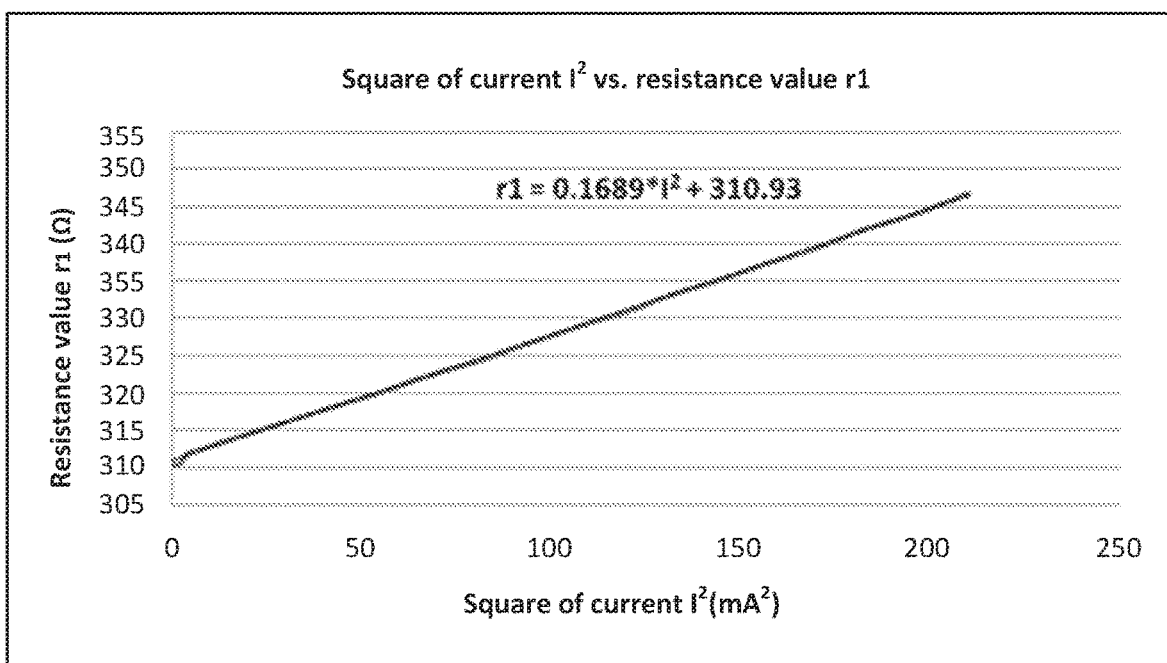
FIG. 11 is a curve fitted to the data in FIG. 10 showing the relationship between resistance value and current squared.

FIGS. 10 and 11 show the experimental data and fitted curve from the third specific illustrative example.

For illustrative purposes, the first wavelength selection component 21, the first thermistor 521, and the first heating component 511 are discussed.

A gradually increasing current I (1 mA, 1.5 mA, 2 mA, ..., 14.5 mA) is supplied to the first heating component 511. At the same time, the resistance value $r_1$ of the corresponding first thermistor 521 is monitored in real-time.

As can be seen, in reference to FIG. 10, as the current I that is supplied to the first heating component 511 increases, the resistance value $r_1$ of the first thermistor 521 exhibits a trend of gradual increase. Although not shown in FIG. 10, the wavelength value $\lambda_1$ of the first wavelength selection component 21 exhibits a trend of gradual increase.

FIG. 11 shows a fitted curve of the relationship between the resistance value $r_1$ of the first thermistor 521 and the square of the current $I^2$, where the relationship between the resistance value $r_1$ and the square of the current $I^2$ is linear. Specifically, the expression of the linear relationship is: $r_1=k''*I^2+c'$, where k'' and c' are both constants. According to the fitting to the actual test data values in this example embodiment, k''=0.1689 and c'=310.93. The values of k'' and c' may be different for a different laser or for the fitted expression of the relationship between the resistance value of the thermistor of a different wavelength selection component and the square of the current. In this example embodiment, the aforementioned fitted expression of the relationship needs to be created for each wavelength selection component and pre-stored in the storage device 54.

As described above, the embodiments of the present disclosure change the temperatures of the corresponding wavelength selection components by heating to realize the thermo-optic effect, and, at the same time, the temperatures of the corresponding wavelength selection components are monitored and controlled in real-time by means of thermistors. In this way, the mutual heat impact between the two wavelength selection components and the temperature drift characteristics of the heating components as a result of heat radiation and heat conduction may be avoided, thereby realizing real-time temperature control and accurate mode selection.

Additionally, in this application, a curve is obtained by fitting to show the relationship between the wavelength drift $\Delta\lambda$ of the wavelength selection component and the resistance change $\Delta R$ of the thermistor. And the target resistance value of the thermistor (i.e., the temperature of the wavelength selection component) corresponding to the target wavelength may be calibrated quickly according to the known initial wavelength, the initial resistance value of the thermistor, and the aforementioned curve of the relationship, thereby saving a majority part of the time for the calibration of the wavelength of the tunable laser and simplifying the mode selection process.

In comparison with currently available technology, a tunable laser wavelength selection method consistent with the disclosed embodiments changes the temperatures of the wavelength selection components by heating according to thermo-optic effect, and, at the same time, the temperatures of the corresponding wavelength selection components are monitored and controlled in real-time by means of thermistors. In this way, mutual heat impact between the two wavelength selection components and the temperature drift characteristics of the heating components as a result of heat radiation and heat conduction, may be avoided, thereby realizing real-time temperature control and accurate mode selection. Additionally, in this disclosure, a curve is obtained by fitting to show the relationship between the wavelength drift $\Delta\lambda$ of the wavelength selection component and the resistance change $\Delta R$ of the thermistor, and the target resistance value of the thermistor (i.e., the temperature of the wavelength selection component) corresponding to the target wavelength may be calibrated quickly according to the known initial wavelength, the initial resistance value of the thermistor, and the aforementioned curve of relationship, thereby saving a majority part of the time for calibrating the wavelength of the tunable laser and simplifying the mode selection process.

It should be understood that despite the descriptions of embodiments in the specification, each embodiment does not entail only one independent technical solution. The specification is written this way simply for the sake of clarity. Persons having ordinary skill in the art should treat the specification as a whole. The technical solutions in the embodiments may be combined in appropriate ways to form other embodiments that may be understood by persons having ordinary skill in the art.

The series of detailed descriptions above is only intended to provide specific descriptions of feasible embodiments of the present disclosure. The detailed descriptions are not to be construed as limiting the scope of protection for the present disclosure. All equivalent embodiments or changes that are not detached from the techniques of the present disclosure in essence should fall under the scope of protection of the present application.

What is claimed is:

1. A wavelength selection method for a tunable laser, providing a Vernier system that comprises at least two thermally tunable wavelength selection components, wherein the at least two thermally tunable wavelength selection components include a first thermally tunable wavelength selection component and a second thermally tunable wavelength selection component, the wavelength selection method comprising:

obtaining a target wavelength $\lambda$;

calculating target resistance values $R_1$ and $R_2$ of two thermistors, respectively, corresponding to the target wavelength $\lambda$, each of the two thermistors being used to monitor the temperature of a corresponding one of the first and second wavelength selection components, each of the target resistance values $R_1$ and $R_2$ being calculated according to a relationship between a wavelength drift $\Delta\lambda$ and a resistance change $\Delta R$ of a corresponding one of the thermistors and according to an initial wavelength $\lambda_0$ and its corresponding one of initial resistance values $R_{01}$ and $R_{02}$ of the corresponding thermistor;

heating the first and second wavelength selection components to control the temperatures of the first and second wavelength selection components until real-time resistance values r1 and r2 of the two thermistors reach the target resistance values $R_1$ and $R_2$, respectively; and stabilizing the real-time resistance values of the two thermistors at the target resistance values $R_1$ and $R_2$, respectively, and outputting a laser beam having the target wavelength $\lambda$, wherein, in in the heating the first and second wavelength selection components to control the temperatures of the first and second wavelength selection components until the real-time resistance values of the two thermistors reach the target resistance values $R_1$ and $R_2$, respectively, the temperatures of the first and second wavelength selection components are adjusted by adjusting currents in first and second heating components disposed on the first and second wavelength selection components, respectively, and wherein the heating the first and second wavelength selection components to control the temperatures of the first and second wavelength selection components until the real-time resistance values of the two thermistors reach the target resistance values $R_1$ and $R_2$, respectively, comprises:

searching for current values $I_1$ and $I_2$ that respectively correspond to the target resistance values $R_1$ and $R_2$ among pre-stored resistance values corresponding to the wavelengths of all communication channels and their corresponding current values;

supplying currents that are equal to the current values $I_1$ and $I_2$ to the first heating component and the second heating component, respectively, and, at the same time, determining whether the real-time resistance values $r_1$ and $r_2$ of the two thermistors are equal to the target resistance values $R_1$ and $R_2$, respectively;

in response to determining that the two real-time resistance values $r_1$ and $r_2$ are not equal to the target resistance values $R_1$ and $R_2$ fine-tuning the supplied currents until the two real-time resistance values $r_1$ and $r_2$ are equal to the target resistance values $R_1$ and $R_2$, respectively; and in response to determining that the real-time resistance values $r_1$ and $r_2$ are equal to the target resistance values $R_1$ and $R_2$, respectively, stabilizing the supplied currents at this time to lock the real-time resistance values $r_1$ and $r_2$ at the target resistance values $R_1$ and $R_2$, respectively.

2. The wavelength selection method of claim 1, wherein Kelvin four-wire method is used to measure the real-time resistance values of the two thermistors.

3. The wavelength selection method of claim 1, further comprising:
determining the relationship between the wavelength drift $\Delta\lambda$ and the resistance change $\Delta R$ for each one of the first and second thermally tunable wavelength selection components; and
storing the determined relationship in a storage device.

4. The wavelength selection method of claim 1, wherein, for each one of the first and second wavelength selection components, there is a linear relationship between a wavelength drift $\Delta\lambda$ and a resistance change of the corresponding thermistor $\Delta R$: $\Delta\lambda = k*\Delta R$; and
coefficients of the relationship between the resistance change $\Delta R$ of the two thermistors and the wavelength drift are $k_1$ and $k_2$, respectively, and the target resistance values are $R_1=(\lambda-\lambda_0)/k_1+R_{01}$ and $R_2=(\lambda-\lambda_0)/k_2+R_{02}$.

5. A wavelength selection method for a tunable laser, providing a Vernier system that comprises at least two thermally tunable wavelength selection components, wherein the at least two thermally tunable wavelength selection components include a first thermally tunable wavelength selection component and a second thermally tunable wavelength selection component,
the wavelength selection method comprising:
obtaining a target wavelength $\lambda$;
calculating target resistance values $R_1$ and $R_2$ of two thermistors, respectively, corresponding to the target wavelength $\lambda$, each of the two thermistors being used to monitor the temperature of a corresponding one of the first and second wavelength selection components, each of the target resistance values $R_1$ and $R_2$ being calculated according to a relationship between a wavelength drift $\Delta\lambda$ and a resistance change $\Delta R$ of a corresponding thermistor and according to an initial wavelength $\lambda_0$ and its corresponding one of initial resistance values $R_{01}$ and $R_{02}$ of the corresponding thermistor;
heating the first and second wavelength selection components to control the temperatures of the first and second wavelength selection components until real-time resistance values r1 and r2 of the two thermistors reach the target resistance values $R_1$ and $R_2$, respectively; and stabilizing the real-time resistance values of the two thermistors at the target resistance values $R_1$ and $R_2$, respectively, and outputting a laser beam having the target wavelength $\lambda$,
wherein, in the heating the first and second wavelength selection components to control the temperatures of the first and second wavelength selection components until the real-time resistance values r1 and r2 of the two thermistors reach the target resistance values $R_1$ and $R_2$, respectively, the temperatures of the first and second wavelength selection components are adjusted by adjusting currents in first and second heating components disposed on the first and second wavelength selection components, respectively, and
wherein the heating the first and second wavelength selection components to control the temperatures of the first and second wavelength selection components until the real-time resistance values r1 and r2 of the two thermistors reach the target resistance values $R_1$ and $R_2$, respectively, comprises:
calculating currents values $I_1$ and $I_2$ that respectively correspond to the two target resistance values $R_1$ and $R_2$, each of the currents $I_1$ and $I_2$ being calculated according to a relationship between a resistance value R of the corresponding thermistor and the current I of the corresponding first or second heating component: $R=m*I^2+R_0$;
supplying currents that are equal to the current values $I_1$ and $I_2$ to the first heating component and the second heating component, respectively, and, at the same time, determining whether the real-time resistance values $r_1$ and $r_2$ of the two thermistors are equal to the target resistance values $R_1$ and $R_2$, respectively;
in response to determining that the two real-time resistance values $r_1$ and $r_2$ are not equal to the target resistance values $R_1$ and $R_2$, fine-tuning the supplied currents until the two real-time resistance values $r_1$ and $r_2$ are equal to the target resistance values $R_1$ and $R_2$; and
in response to determining that the two real-time resistance values $r_1$ and $r_2$ are equal to the target resistance values $R_1$ and $R_2$, respectively, stabilizing the supplied currents at this time to lock the real-time resistance values $r_1$ and $r_2$ at the target resistance values $R_1$ and $R_2$, respectively.

6. A wavelength selection device in a tunable laser, comprising:
at least two thermally tunable wavelength selection components on an optical path, the at least two thermally tunable wavelength selection components including a first wavelength selection component and a second wavelength selection component; and
a control component, comprising:
a controller;
a storage device;
a first heating component to heat the first wavelength selection component;
a second heating component to heat the second wavelength selection component;
a first thermistor to monitor the first wavelength selection component; and
a second thermistor to monitor the second wavelength selection component,
wherein:
the storage device is configured to pre-store, for each one of first and second wavelength selection components, an expression of a relationship $\Delta\lambda=k*\Delta R$ between a wavelength drift Δλ of the wavelength selection component and a resistance change ΔR of a corresponding thermistor, as well as an initial wavelength $\lambda_0$ and a corresponding one of an initial resistance value $R_{01}$ of the first thermistor and an initial resistance value $R_{02}$ of the second thermistor, and the controller is configured to:
   calculate target resistance values $R_1$ and $R_2$ of the first thermistor and the second thermistor, respectively, corresponding to a target wavelength λ by using data stored in the storage device; and
   stabilize real-time resistance values of the first thermistor and the second thermistor, respectively, at the target resistance values $R_1$ and $R_2$ by controlling currents in the first heating component and the second heating component,
wherein in in stabilizing the real-time resistance values of the first thermistor and the second thermistor, respectively, at the target resistance values $R_1$ and $R_2$, the controller is configured to:
   calculate currents values $I_1$ and $I_2$ that respectively correspond to the two target resistance values $R_1$ and $R_2$, each of the currents $I_1$ and $I_2$ being calculated according to a relationship between a resistance value R of the corresponding thermistor and the current I of the corresponding first or second heating component: $R=m*I^2+R_0$;
   control the currents in the first heating component and the second heating component to be equal to the current values $I_1$ and $I_2$, respectively, and, at the same time, determine whether the real-time resistance values $r_1$ and $r_2$ of the two thermistors are equal to the target resistance values $R_1$ and $R_2$, respectively;
   in response to determining that the two real-time resistance values $r_1$ and $r_2$ are not equal to the target resistance values $R_1$ and $R_2$, fine-tune the currents in the first heating component and the second heating component until the two real-time resistance values $r_1$ and $r_2$ are equal to the target resistance values $R_1$ and $R_2$; and
   in response to determining that the two real-time resistance values $r_1$ and $r_2$ are equal to the target resistance values $R_1$ and $R_2$, respectively, stabilize the currents at this time to lock the real-time resistance values $r_1$ and $r_2$ at the target resistance values $R_1$ and $R_2$, respectively.

7. The wavelength selection device of claim 6, wherein each of the first thermistor and the second thermistor has two ends, and
   for each end of each of the first thermistor and the second thermistor, a current wire terminal and a voltage wire terminal for measuring the thermistor are disposed.

8. The wavelength selection device of claim 6, wherein the first heating component and the first thermistor are both disposed on a light passing surface of the first wavelength selection component and are distributed on an outside margin of the optical path, and
   the second heating component and the second thermistor are both disposed on a light passing surface of the second wavelength selection component and are distributed on the outside margin of the optical path.

* * * * *